(12) United States Patent
Chen et al.

(10) Patent No.: US 6,998,333 B2
(45) Date of Patent: *Feb. 14, 2006

(54) METHOD FOR MAKING NANOSCALE WIRES AND GAPS FOR SWITCHES AND TRANSISTORS

(75) Inventors: Yong Chen, Redwood City, CA (US); R. Stanley Williams, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/923,199

(22) Filed: Aug. 20, 2004

(65) Prior Publication Data

US 2005/0093025 A1   May 5, 2005

Related U.S. Application Data

(60) Continuation of application No. 10/697,589, filed on Oct. 30, 2003, which is a division of application No. 10/104,348, filed on Mar. 22, 2002, now Pat. No. 6,699,779.

(51) Int. Cl.
*H01L 21/44* (2006.01)
(52) U.S. Cl. ............... 438/607; 438/945; 438/962
(58) Field of Classification Search ............ 438/607, 438/945, 962
See application file for complete search history.

(56) References Cited

U.S. PATENT DOCUMENTS

| | | | |
|---|---|---|---|
| 5,045,408 A | | 9/1991 | Williams et al. |
| 5,972,744 A | * | 10/1999 | Morimoto et al. .......... 438/197 |
| 6,010,934 A | | 1/2000 | Wu |
| 6,128,214 A | | 10/2000 | Kuekes et al. |
| 6,286,226 B1 | | 9/2001 | Jin |
| 6,413,880 B1 | | 7/2002 | Baski et al. |
| 6,509,619 B1 | | 1/2003 | Kendall et al. |
| 6,515,339 B1 | | 2/2003 | Shin et al. |
| 6,699,779 B1 | * | 3/2004 | Chen et al. ............... 438/607 |
| 6,707,098 B1 | | 3/2004 | Hofmann et al. |
| 6,773,616 B1 | * | 8/2004 | Chen et al. ............... 216/41 |
| 2002/0024065 A1 | | 2/2002 | Lee et al. |

OTHER PUBLICATIONS

Yong Chen, et al.; "Nanowires of Four Epitaxial Hexagonal Silicides Grown on SI(001)"; Mar. 1, 2002; Journal of Applied Physics, pp. 3213-3218.

Yong Chen, et al.; "Self-Assembled Growth of Epitaxial Erbium Disilicide Nanowires of Silicon (001)"; Jun. 26, 2000; Applied Physics Letters, vol. 76, No. 26.

Kakushima, K., et al.; "Fabrication of Various Shapes Nano Structure Using SI Anisotropic Etching and Silicidation"; 2001; 11$^{TH}$ International Conference on Solid State Sensors and Actuators, Munich, Germany.

(Continued)

*Primary Examiner*—Howard Weiss

(57) ABSTRACT

A method for forming first and second linear structures of a first composition that meet at right angles, there being a gap at the point at which the structures meet. The linear structures are constructed on an etchable crystalline layer having the first composition. First and second self-aligned nanowires of a second composition are grown on this layer and used as masks for etching the layer. The self-aligned nanowires are constructed from a material that has an asymmetric lattice mismatch with respect to the crystalline layer. The gap is sufficiently small to allow one of the structures to act as the gate of a transistor and the other to form the source and drain of the transistor. The gap can be filled with electrically switchable materials thereby converting the transistor to a memory cell.

12 Claims, 2 Drawing Sheets

OTHER PUBLICATIONS

A. Dutta, et al.;"Silicon-Based-Single-Electron Memory Using a Multiple-Tunnel JunctionFabricated by Electron-Beam Direct Writing";Sep. 6, 1999; Applied Physics Letters, vol. 75 No. 10.

Yong Chen, et al.; Self-Assembled Rare-Earth Silicide Nanowires on SI(001); May 29, 2001 Physical Review B, vol. 63, 4 pages.

* cited by examiner

METHOD FOR MAKING NANOSCALE WIRES AND GAPS FOR SWITCHES AND TRANSISTORS

This Application is a Continuation Application of the co-pending, commonly-owned U.S. patent application, Ser. No. 10/697,589, filed Oct. 30, 2003, by Y. Chen et al., and entitled "A Method for Making Nanoscale Wires and Gaps for Switches and Transistors," which in turn is a Divisional Application of the prior U.S. patent application, Ser. No. 10/104,348, filed Mar. 22, 2002, now U.S. Pat. No. 6,699,779.

FIELD OF THE INVENTION

The present invention relates to nanoscale electric devices, and more particularly, to a method for making nanoscale wires and gaps for switches and transistors.

BACKGROUND OF THE INVENTION

Reducing the feature size of integrated circuit components is a continuing goal of semiconductor process designers. In the past, such reductions have led to decreased cost and increased operating speed. Device fabrication depends on techniques that rely on masks to define the boundaries of the transistors and conductors. For example, metal and semiconductor conductor patterns are fabricated by lithography in which masks determine the location and size of the patterns. The conductivity in semiconductors can also be controlled by implanting ions. The areas that are to be implanted are typically defined by an opening in a mask. Similarly, transistors require the selective implantation of ions. Unfortunately, conventional masking techniques are inadequate when nanometer scale components are to be fabricated.

Broadly, it is the object of the present invention to provide a self-assembled masking technique for use in fabricating nanoscale wires and devices in integrated circuits.

These and other objects of the present invention will become apparent to those skilled in the art from the following detailed description of the invention and the accompanying drawings.

SUMMARY OF THE INVENTION

The present invention is a method for forming first and second linear structures of a first composition that meet at right angles, there being a gap at the point at which the structures meet. The linear structures are constructed on an etchable crystalline layer having the first composition. First and second self-aligned nanowires of a second composition are grown on a surface of the etchable crystalline layer, the first nanowire growing at right angles to the second nanowire. The first nanowire is separated from the second nanowire by a gap of less than 10 nm at their closest point. Portions of the etchable layer that are not under the first and second nanowires are then etched using the first and second nanowires as a mask thereby forming the first and second linear structures of the first composition. The nanowires are grown by depositing a material of the second composition which forms crystals on the surface that have an asymmetric lattice mismatch with respect to the crystalline surface. The linear structures so formed are well suited for the fabrication of nanoscale transistors having a first elongated doped semiconductor wire having a width between 1–100 nm on an insulative substrate. A second wire at right angles to the first ridge acts as the gate of the transistor. The two wires are separated by a gap of between 0.4 and 10 nm at their closest point. By filling the gaps with appropriate materials, the wires and gaps can also function as a nanoscale memory switch and a transistor.

DETAILED DESCRIPTION OF THE INVENTION

Figure 1A:
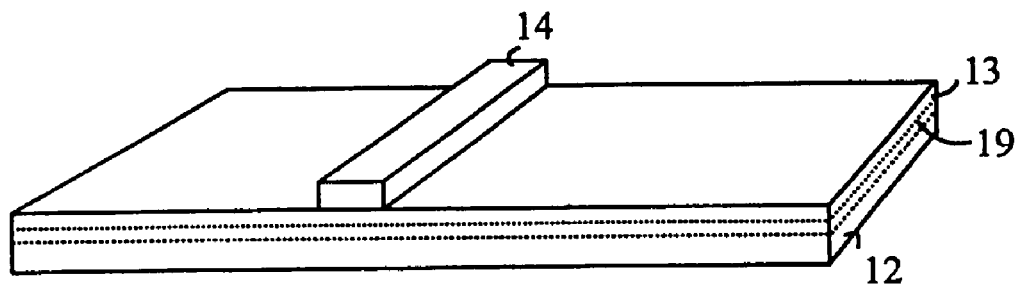
FIGS. 1(A)–(C) are prospective views at various stages in the fabrication process of a substrate 12 in which nanowires are to be constructed.

The present invention is based on the observation that thin "nanowires" of $ErSi_2$ can be grown epitaxially on the (001) plane of silicon without masking the silicon. The manner in which these wires are grown is discussed in detail in "Self-assembled growth of epitaxial erbium disilicide nanowires on silicon (001)" by Yong Chen, Douglas A. A. Ohlberg, Gilberto Medeiros-Ribeiro, Y. Austin Chang, and R. Stanley Williams in Applied Physics Letters, 76, p. 4004, June 2000, which is hereby incorporated by reference. The $ErSi_2$ nanowires are grown by depositing Er on the surface of the silicon and then heating the silicon to drive the reaction to completion. The Er can be deposited with an in situ electron-beam evaporator at temperatures between room temperature and 620° C. The annealing operation can be carried out at temperatures between 575 and 800° C. The resulting nanowires are oriented along the two perpendicular <110> directions ([110] and [1-10]) and at right angles thereto.

The self-assembly of the nanowires depends on an asymmetric lattice mismatch between the ErSi2 and the underlying silicon substrate. The overlayer material must be closely-lattice matched to the substrate along one major crystallographic axis but have a significant lattice mismatch along all other crystallographic axes within the interface between the epitaxial crystal and the substrate. In principle, this allows the unrestricted growth of the epitaxial crystal in the first direction but limits the width in the other.

While the example given herein utilizes $ErSi_2$ grown over Si, other materials and substrates can be utilized. In general, any crystalline material that can be characterized by an asymmetric lattice mismatch, in which the first material has a close lattice match (in any direction) with the second material and has a large lattice mismatch along all other crystallographic axes within the interface between the epitaxial crystal and the substrate. For example, $ScSi_2$, $GdSi_2$, and $DySi_2$ grown on Si(001) substrates may also be utilized. Such structures are taught in Yong Chen, Douglas A. A. Ohlberg, and R Stanley Williams in Journal of Applied Physics, 91, p. 3213, March 2002, which is hereby incorporated by reference. A close lattice match means that the absolute value of lattice mismatch between the two crystal materials is less than 4%. A large lattice mismatch means that the absolute value of lattice mismatch between the two crystal materials is within the range of about 4 to 10%. While any crystallographic direction may be chosen, the present invention preferably utilizes a material having the asymmetric lattice mismatch along a major (or low Millerindex) crystallographic direction within the interface between the epitaxial crystal and the substrate. By "major crystallographic direction" is meant any direction along which the crystalline material comprising the nanowire may prefer to grow within the interfacial plane.

In the case of $ErSi_2$, $ScSi_2$, $GdSi_2$, and $DySi_2$ nanowires, the nanowires are typically 2–20 nm wide and have lengths of a few hundred nm. The nanowires are self-elongating once the silicide crystal has been seeded at a particular location. The nanowires can be seeded at locations where special seeding materials or growth windows are predefined by lithography methods.

Figure 1B:
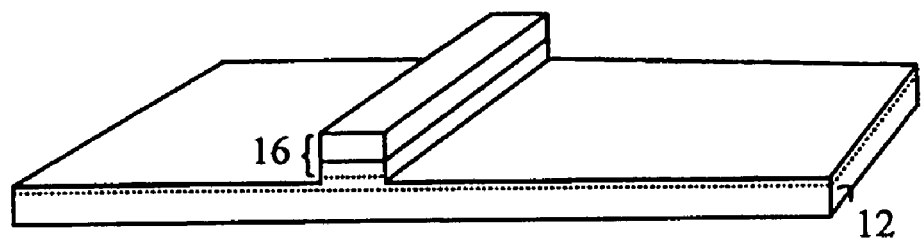
Figure 1C:
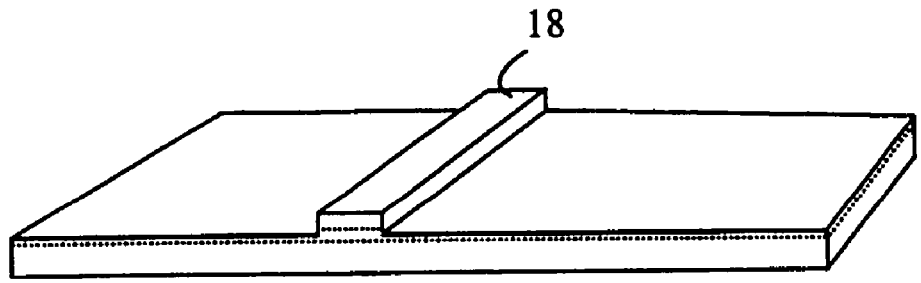

The manner in which these nanowires are utilized to generate two silicon nanowires at the right angle and a nanoscale gap between them will now be explained with reference to FIGS. 1(A)–(C) which are prospective views of a silicon substrate 12 in which a single conducting silicon nanowire is to be constructed at various stages in the fabrication process. The upper region 13 of silicon substrate 12 is doped with a suitable element to render the material conducting. An insulating layer 19 such as $SiO_x$ is buried under the conductive layer. The insulating layer typically has a thickness between 1–500 nm. The insulating layer can be made by implanting oxygen ions into the silicon substrate and then annealing the substrate to form a buried layer of $SiO_x$. An $ErSi_2$ nanowire 14 is then deposited over the region of substrate 12 that is to contain the silicon nanowire. FIG. 1(B) illustrates a prospective view of the present invention wherein the portions of the material that were above the insulating layer but not masked by the nanowire have been removed leaving a ridge 16 having an $ErSi_2$ layer on the top thereof. These portions can be removed by reactive ion etching (RIE). The etching can be stopped at the exposed surface of the insulating layer. Finally, the $ErSi_2$ can be removed, if desired, by selective chemical etching leaving the Si nanowire 18 as shown in FIG. 1(C).

The present invention is based on the observation that the $ErSi_2$ nanowires provide a masking pattern that is ideal for the fabrication of nanoscale gaps for transistors and memory switches. The $ErSi_2$ nanowires grow along the [110] crystal direction and also along the [1-10] direction. When two of these nanowires are seeded such that the two nanowires will meet at right angles, a nanoscale gap can be formed between the first and the second nanowires at the point at which one nanowire meets the other nanowire at a right angle. The growth of the first nanowire will be stopped as it gets close to the second nanowire since the two nanowires have different crystallographic orientations.

Figure 2:
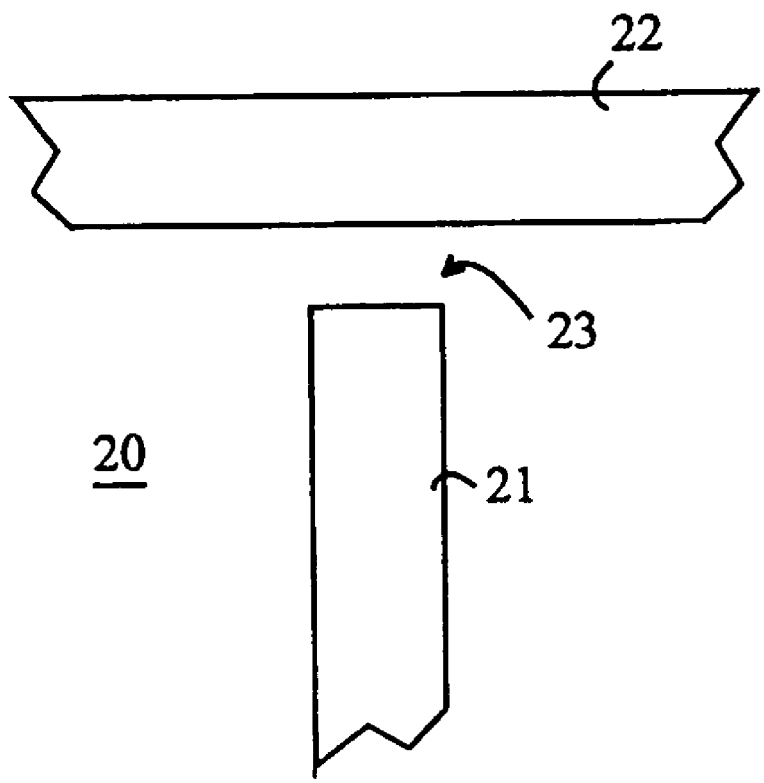
FIG. 2 is a top view of a portion of a substrate 20 on which two self-assembled nanowires and a nanoscale gap shown at 21 and 22 have been grown.

Refer now to FIG. 2, which is a top view of a portion of a silicon substrate 20 on which two $ErSi_2$ nanowires shown at 21 and 22 have been grown. When two $ErSi_2$ wires meet at right angles, a small gap 23 remains between the $ErSi_2$ nanowires. The gap is typically 0.4–10 nm.

Figure 3:
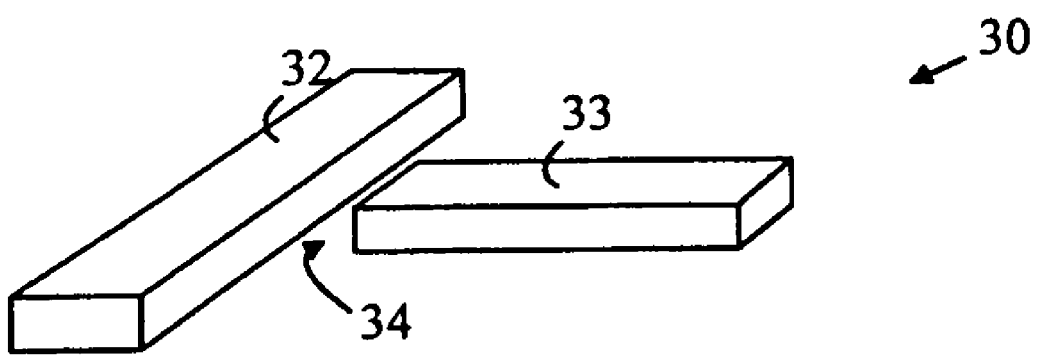
FIG. 3 is a perspective view of a semiconductor nanowire structure that forms a transistor.

Refer now to FIG. 3, which is a perspective view of a silicon nanowire structure that forms a switch or a transistor. Transistor 30 is constructed from two silicon nanowires shown at 32 and 33. Nanowire 33 acts as the gate of transistor 30. The ends of nanowire 32 form the source and drain of transistor 30. Nanowires 32 and 33 are fabricated using a mask of the type shown in FIG. 2. Due to the small gap distance 34, when a voltage is applied on nanowire 32, the electric field will influence and control the current flow in nanowire 33. The gap can be filled with a material such as molecules, ferroelectric materials, and nanoscale particles that store charge or electric dipole moment in the gap. Hence, the transistor can provide gain or nonvolatile switching for logic and memory applications. If two-electrode devices are formed between the nanowires 32 and 33, an electric field applied between the two electrodes can switch the electric conductivity of the materials adjacent to the gap. Such a device is taught in U.S. Pat. No. 6,128,214, which describes how a memory cell can be formed between the two nanowires.

While the above embodiments of the present invention have been described in terms of masks generated from $ErSi_2$ nanowires, as noted above, other materials can be utilized. In general, any material that has a sufficiently asymmetric lattice mismatch can be utilized over an appropriate substrate. Metal silicides represented as the chemical formula $MSi_2$ grown over silicon are examples of such nanowire systems. Here, M is a metal selected from the group consisting of Sc, Y, and the rare earths. The preferred rare earths are Er, Dy, Gd, Th, Ho, Tb, Y, Sc, Tm, and Sm.

In principle, any single crystal material that is useful in the fabrication of nanowires may be used in combination with any single crystal material that serves as a layer on which the nanowires can be grown, provided that the asymmetric lattice mismatch conditions described above are met. The present invention may be practiced using self-assembled crystals grown on single crystal layers such as metals, insulators such as sapphire, and semiconductors such as germanium, III-V compound semiconductors, whether binary (e.g., GaAs, InP, etc.), ternary (e.g., InGaAs), or higher (e.g., InGaAsP), II-VI compound semiconductors, and IV-VI compound semiconductors. Examples of such combinations are listed in U.S. Pat. No. 5,045,408, entitled "Thermodynamically Stabilized Conductor/Compound Semiconductor Interfaces", issued on Sep. 3, 1991, to R. Stanley Williams et al, the contents of which are incorporated herein by reference. Specific examples of semiconductor substrate materials include Si, Ge, $Ge_xSi_{1-x}$ where $0<x<1$, GaAs, InAs, AlGaAs, InGaAs, AlGaAs, GaN, InN, AlN, AlGaN, and InGaN. Specific examples of metal substrate materials include Al, Cu, Ti, Cr, Fe, Co, Ni, Zn, Ga, Nb, Mo, Pd, Ag, In, Ta, W, Re, Os, Ir, Pt, and Au, and alloys thereof.

Various modifications to the present invention will become apparent to those skilled in the art from the foregoing description and accompanying drawings. Accordingly, the present invention is to be limited solely by the scope of the following claims.

What is claimed is:

1. A method for forming linear structures, said method comprising:
    growing first and second self-aligned nanowires of a second composition on a surface of an etchable crystalline layer of a first composition, said first nanowire growing at approximately a right angle to said second nanowire, said first nanowire being separated from said second nanowire by a first gap; and
    etching portions of said etchable crystalline layer that are not under said first and second nanowires using said first and second nanowires as a mask to form a first linear structure and a second linear structure of said first composition, said first linear structure at approximately a right angle to said second linear structure and separated by a second gap.

2. The method of claim 1 wherein said etchable crystalline layer has an insulating layer beneath said etchable crystalline layer and wherein said step of etching portions of said etchable crystalline layer removes material of said first composition down to said insulating layer.

3. The method of claim 1 wherein said step of growing said first and second self-aligned nanowires comprises depositing material of said second composition on said surface of said etchable crystalline layer and wherein said material of said second composition forms crystals on said surface of said etchable crystalline layer that have an asymmetric lattice mismatch with respect to said surface of said etchable crystalline layer.

4. The method of claim 3 wherein said lattice mismatch is less than 4 percent in the directions that are parallel to the directions of said first and second nanowires and greater than 4 percent in all other directions on said surface of said etchable crystalline layer.

5. The method of claim 1 wherein said first composition comprises silicon and wherein said second composition comprises a metal silicide of the chemical formula $MSi_2$, where M is a metal selected from the group consisting of Sc, Y, and the rare earth elements.

6. The method of claim 5 wherein a rare earth element is chosen from the group consisting of Er, Dy, Gd, Th, Ho, Tb, and Sm.

7. The method of claim 1 wherein said first composition comprises a semiconductor chosen from the group consisting of Si, Ge, $Ge_xSi_{1-x}$ where $0<x<1$, GaAs, InAs, AlGaAs, InGaAs, GaN, InN, AlN, AlGaN, and InGaN.

8. The method of claim 1 wherein said first composition comprises a metal chosen from the group consisting of Al, Cu, Ti, Cr, Fe, Co, Ni, Zn, Ga, Nb, Mo, Pd, Ag, In, Ta, W, Re, Os, Ir, Pt, and Au, and alloys thereof.

9. The method of claim 1 wherein said step of growing said first and second self-aligned nanowires comprises depositing an island of a seed material at a location that determines the location of said first self-aligned nanowire.

10. The method of claim 9 wherein said island is less than 10 nm in width.

11. The method of claim 9 wherein said second composition comprises a metal silicide of the chemical formula $MSi_2$, and wherein said seed material comprises the element M.

12. The method of claim 1 wherein said first gap is less than 10 nm.

* * * * *